(12) United States Patent
Jairazbhoy et al.

(10) Patent No.: US 6,977,346 B2
(45) Date of Patent: Dec. 20, 2005

(54) VENTED CIRCUIT BOARD FOR COOLING POWER COMPONENTS

(75) Inventors: Vivek A. Jairazbhoy, Farmington Hills, MI (US); Andrew Z. Glovatsky, Plymouth, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 150 days.

(21) Appl. No.: 10/458,448

(22) Filed: Jun. 10, 2003

(65) Prior Publication Data

US 2003/0226688 A1  Dec. 11, 2003

Related U.S. Application Data

(60) Provisional application No. 60/387,629, filed on Jun. 10, 2002.

(51) Int. Cl.[7] .............................................. H05K 1/00
(52) U.S. Cl. ...................... 174/252; 174/255; 174/262
(58) Field of Search ................................ 174/252, 262, 174/264, 266, 261, 260, 255; 257/711, 721, 257/713, 207, 719, 720; 361/760, 718, 719, 361/720, 692, 709, 688, 689, 690, 694, 695, 361/704, 707, 717

(56) References Cited

U.S. PATENT DOCUMENTS

| | | | |
|---|---|---|---|
| 3,801,388 A | * | 4/1974 | Akiyama et al. .............. 216/20 |
| 4,404,059 A | | 9/1983 | Livshits et al. |
| 4,839,774 A | * | 6/1989 | Hamburgen ................. 361/693 |
| 5,049,982 A | * | 9/1991 | Lee et al. .................... 257/722 |
| 5,738,797 A | | 4/1998 | Belke, Jr. et al. |
| 6,205,028 B1 | * | 3/2001 | Matsumura .................. 361/720 |
| 6,365,057 B1 | * | 4/2002 | Whitehurst et al. ........... 216/13 |
| 6,391,211 B1 | | 5/2002 | Glovatsky et al. |

* cited by examiner

*Primary Examiner*—Kamand Cuneo
*Assistant Examiner*—Ishwar (I. B.) Patel
(74) *Attorney, Agent, or Firm*—Brinks Hofer Gilson & Lione

(57) ABSTRACT

The present invention provides a circuit board including a first conductor layer forming a plurality of conductive circuit traces for interconnecting electronic components. The circuit board includes a substrate for supporting the first conductor layer and a pedestal formed from the substrate for supporting at least one of the plurality of electronic components. The pedestal provides a heat conduction path for conducting heat away from the at least one of the plurality of electronic components and a aperture in the substrate adjacent the pedestal for allowing a fluid to pass through the substrate.

16 Claims, 4 Drawing Sheets

VENTED CIRCUIT BOARD FOR COOLING POWER COMPONENTS

CROSS-REFERENCE TO RELATED APPLICATION

The present invention claims priority to U.S. Provisional Application Ser. No. 60/387,629, filed Jun. 10, 2002, entitled "Etched Trimetal Thermal Management".

TECHNICAL FIELD

The present invention relates to systems and methods for mounting power devices in electronic assemblies and to systems and methods for removing heat from such devices.

BACKGROUND

Conventional electronic assemblies include surface mount devices that may be transistors, amplifiers, or the like. These devices in operation create heat that must be removed from the surface of the device to avoid overheating and damage to the components. Prior art methods for removing heat from power devices include drilling thermal via holes through the bond pad and circuit board and metallizing these holes to provide a thermal path to the opposite side (or bottom side) of the board. These vias must be filled, typically with epoxy material, to prevent flux (which results in corrosion) from flowing through the holes to the opposite side of the circuit board. The heat removed to the bottom side of the circuit board must then be transported to a heat sink especially designed to dissipate the heat to the surrounding environment.

All the power devices that are thermally connected to the heat sink must be electrically isolated. Typically, this is accomplished by attaching the heat sink to the circuit board metallizations on the bottom side of the circuit board via a thermally conductive, electrically insulative adhesive. The adhesive layer contributes significantly to the overall thermal resistance necessitating a larger heat sink and limiting the heat removal capacity of the thermal stack. However, this process of removing heat from the power devices is costly due to the complex procedure of drilling metallizing and filling vias.

Other prior art methods for removing heat from power devices utilize, etched tri-metal (ETM) structures. In such ETM based systems, etched pedestals are created from ETM structures and serve the function of the filled vias that connect one side of a circuit board to the other side. More specifically, heat from power components passes through the entire copper backed ETM stack before being dissipated through a heat sink on the opposite side of the circuit board. For example, the heat sink may be a metal cross-car beam that supports an instrument panel in a vehicle. This construction provides a thorough path while electrically isolating the power components. Advantageously, such constructions create a thermal path through the substrate that is unimpeded by poorly conducting material. For example, a solder connection could be established between the top side circuit (onto which the power device is soldered) and the bottom side circuit. Alternatively, two solder connections to a core layer, one with the top side circuit and the other with the bottom side circuit could form a pass through with no poorly conducting materials in the thermal path. If a core pedestal is used, the pedestal may be electrically isolated from the ground by creating an island in the core, as disclosed in the above references. If a solder slug is used to connect the top and bottom layers, a hole in the ground plane may be drilled or etched to a larger diameter than the ETM layers ensuring that the solder does not wet the core.

While the above-mentioned prior art systems and a method do indeed reduce the resistance of the thermal stack upstream of the adhesive layer that bonds the circuit to the heat sink, increased heat transfer rates would be desirable. All of the heat transfer within the substrate is accomplished through heat conduction. One known problem that the prior art does not address is that heated air, in some instances, is trapped against the substrate and results in a reduced heat transfer efficiency.

Therefore, there is a need to improve the heat transfer rates through and around electronic circuit board and substrate that is absorbing and transferring heat from power devices. Therefore, the new and improved system and method for transferring heat from the circuit board should increase the rate of heat transfer from the thermal stack.

SUMMARY

In an aspect of the present invention a circuit board adapted to remove heat from a power component is provided. The circuit board includes a first conductor layer forming a plurality of conductive circuit traces for interconnecting electronic components. Further, a substrate is provided for supporting the first conductor layer and a pedestal formed from the substrate for supporting at least one of the plurality of electronic components. The pedestal provides a heat conduction path for conducting heat away from the at least one of the plurality of electronic components. A aperture is provided in the substrate adjacent the pedestal for allowing a fluid to pass through the substrate.

In another aspect of the present invention, the circuit board includes the first conductor layer which is an etched tri-metal circuit and a second conductor layer forming a plurality of conductive circuit traces for interconnecting electronic components.

In yet another aspect of the present invention, the circuit board includes a substrate having a plurality of metal layers including a copper metal layer, and a first intermediate layer disposed between the first conductor layer and the substrate.

In yet another aspect of the present invention, the circuit board includes a pedestal portion of the first intermediate layer and a portion of the substrate.

In yet another aspect of the present invention, a solder layer is disposed between the first conductor layer and the substrate and between the at least one of the plurality of electronic components and the pedestal.

In still another aspect of the present invention, a plurality of bridges are connected at a first end to the pedestal and at a second end to the substrate. The bridges are formed from the first conductor layer and the substrate.

In still another aspect of the present invention, apertures are defined by the area between the pedestal, and the plurality of bridges and are formed from the first conductor layer.

These and other aspects and advantages of the present invention will become apparent upon reading the following detailed description of the invention in combination with the accompanying drawings.

DETAILED DESCRIPTION

Figure 1A:
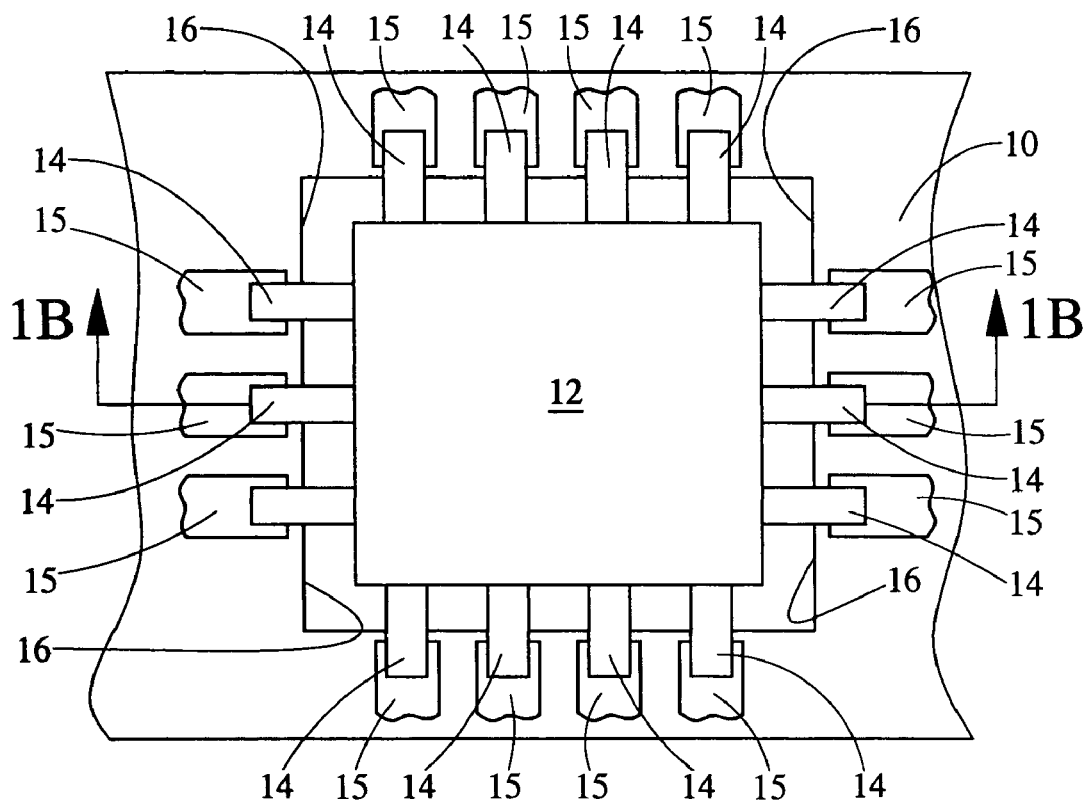
FIG. 1a is a plan view of a portion of a circuit board illustrating the electrical and mechanical connection of a power device to the circuit board, in accordance with the present invention.

FIG. 1a is a plan view of a portion of a circuit board 10 adapted for attaching a power device 12. As conventionally known, power device 12 includes connector tabs 14 for electrically interconnecting (soldering) the power device to conductor pads 15 are contiguous with conductor traces on circuit board 10. The power devices along with other electrical components and the conductor traces form the electrical circuit on circuit board 10. In an embodiment of the present invention, through vents or apertures 16 disposed in circuit board 10 and surrounding power device 12 are provided. Apertures 16 as will be further described and illustrated, provides a flow path that allows fluid such as air to circulate through circuit board 10 and around power device 12. Thus, during operation power device 12 is cooled through heat convection whereby the heat generated by power device 12 is transferred to the air flowing over the power device.

Figure 1B:
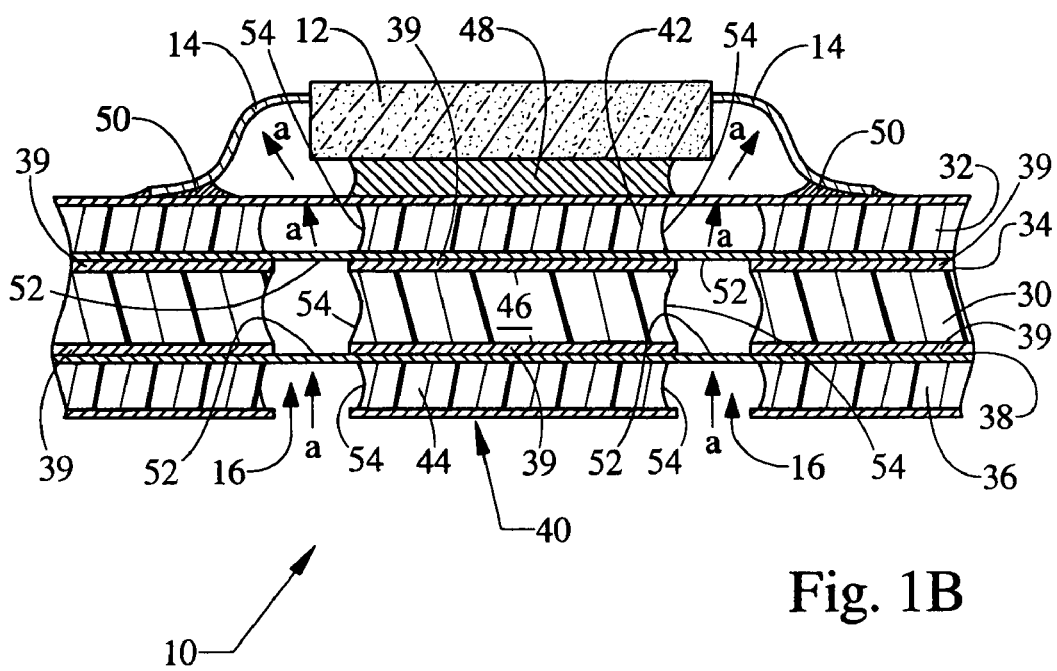
FIG. 1b is a cross-sectional view through the power device and circuit board illustrated in FIG. 1a, in accordance with the present invention.

Referring now to FIG. 1b, a cross-sectional view through power device 12 and circuit board 10 is further illustrated, in accordance with the present invention. As shown in FIG. 1b, circuit board 10 in an embodiment of present invention includes a core layer or substrate 30 having a first ETM layer 32 attached to a first core layer surface 34 and a second ETM layer 36 attached to a second core layer surface 38. An adhesive layer 39 secures first and second ETM layers 32, 36 to core layer 30. Adhesive layer 39 may be any dielectric adhesive suitable for securing and electrically isolating, layers 32, 36 from core layer 30. First and second ETM layers 32, 36 typically are comprised of three metals, such as copper, aluminum and copper. The present invention contemplates various ETM configurations wherein for example aluminum is the middle layer and copper material forms the outer layers to form a copper aluminum copper ETM layer. Core layer or substrate 30 may be copper or any other suitable material. The construction and manufacturing of ETM is disclosed for example in the following U.S. patents having U.S. Pat. Nos. 6,391,211; 5,738,797; 4,404,059; and 3,801,388, incorporated herein by reference.

A center stack or pedestal 40 is created in circuit board 10 by forming through apertures 16 through first and second ETM layers 32, 36 and core layer 30. Center stack 40 may include the same number and kind of layers as circuit board 10 or the number and layer configurations of stack 40 may be different than the circuit board 10. For example, center stack 40 includes a first and second ETM layer 42 and 44 disposed on either side of a core layer 46. Furthermore, center stack 40 may be comprised of the same or different materials such as copper and aluminum as found in the rest of circuit board 10. Through apertures 16 may completely surround power device 12 or be positioned on only one side of power device 12.

Power device 12 is attached to stack 40 via a solder paste or other die attachment material 48. Connector tabs 14 are electrically interconnected, in a conventional manner, to connector pads 15 on circuit board 10 through solder or other material 50. As will be shown in the subsequent figures, stack 40 is mechanically connected to circuit board 10 through bridges 52. As will be described and illustrated, bridges 52 may be comprised of portions of the core layer or ETM layers. Air flow through circuit board 10 and across side surfaces 54 of stack 40 is illustrated and represented by arrows A. Thus, it is readily apparent how heat transfers from the power die to the stack and then to the surrounding air occurs through natural convection.

Figure 2:
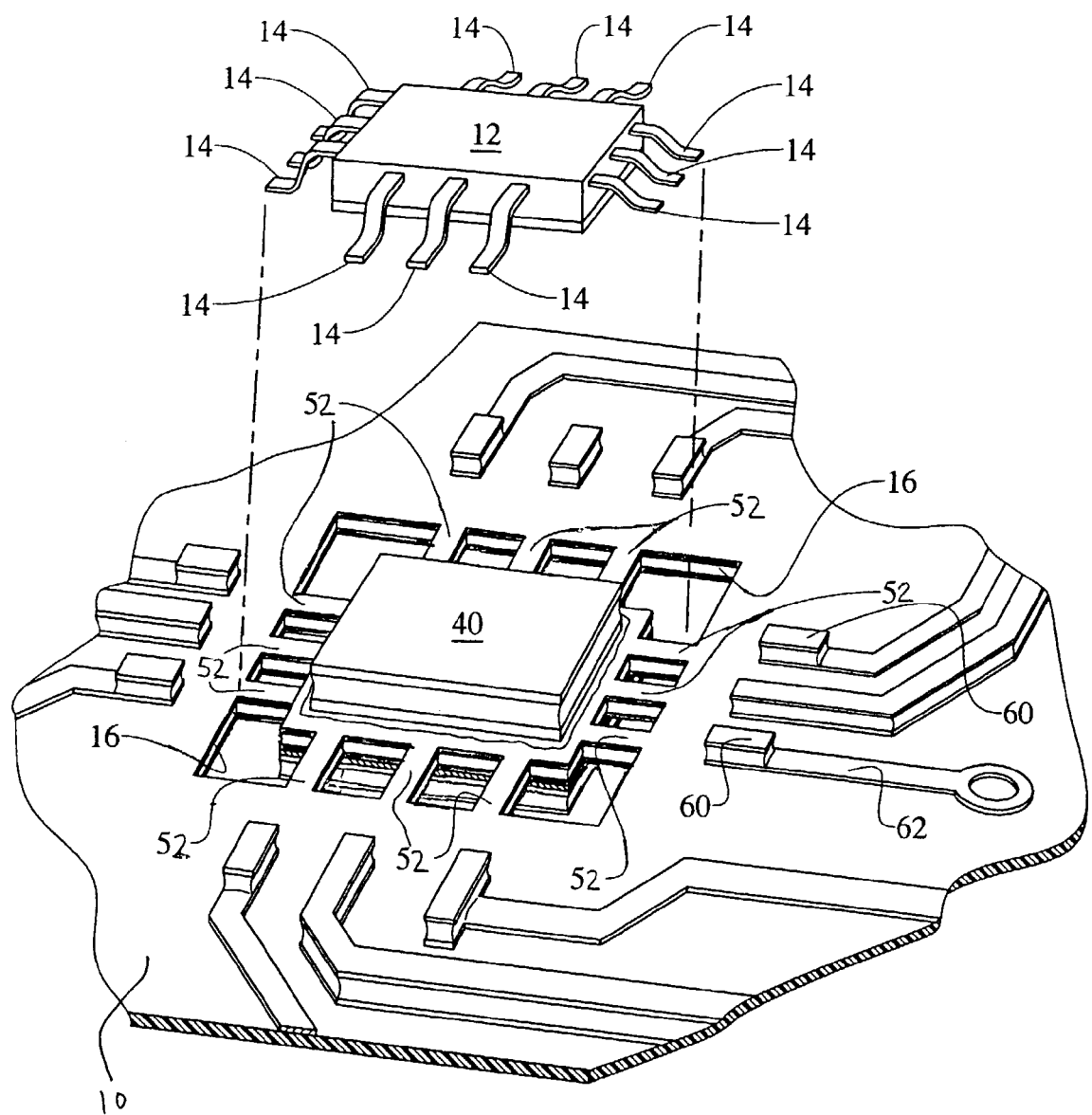
FIG. 2 is a perspective view of a power device to be mounted on a portion of a circuit board illustrating the thermal stack and apertures through the circuit board, in accordance with the present invention.

Referring now to FIG. 2, a perspective view of circuit board 10 having apertures 16 and a center stack 40 is further illustrated, in accordance with the present invention. FIG. 2 further illustrates the attachment of stack 40 to the rest of circuit board 10 as shown. Apertures 16 divide or separate stack 40 from the rest of circuit board 10. The plurality of bridges 52 mechanically connect stack 40 to circuit board 10. As conventionally known, as disclosed in the above-referenced patents, the ETM layers 32 may be etched to form power die connector pads 60 and circuit traces 62 that connect power die 12 to the rest of the circuit on circuit board 10.

Figure 3:
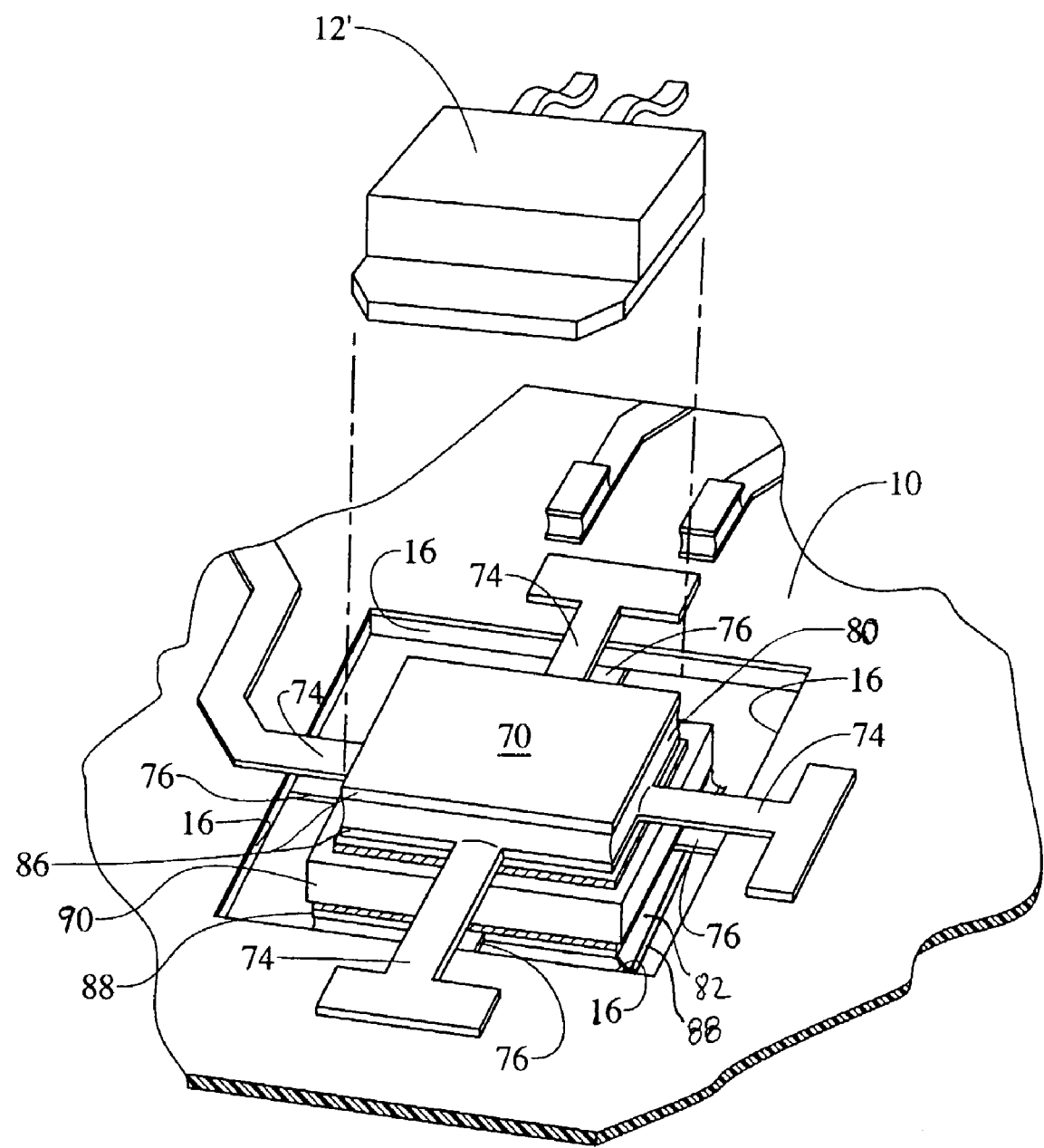
FIG. 3 is a perspective view of a portion of a circuit board including a vented thermal stack wherein the core layer in the thermal stack is separated from the rest of the core layer in the circuit board, in accordance with the present invention.

Referring now to FIG. 3, a center stack 70 is illustrated in a perspective view, in accordance with an embodiment of the present invention. In the present embodiment, center stack 70 is mechanically attached to the rest of circuit board 10 by bridges 74 and 76 that are formed from portions of a first ETM layer 80 and a second ETM layer 82, respectively. More specifically, as previously described ETM layer 80 and 82 may be comprised of an aluminum layer sandwiched between two copper layers. Thus, as illustrated in FIG. 3, a portion of one of the copper layers 86 forms bridges 74 and a portion of one of the copper layers 88 forms bridges 76. In this manner, core layer 90 of center stack 20 is isolated from the rest of the core layer of circuit board 10 via cooling apertures 16.

Figure 4:
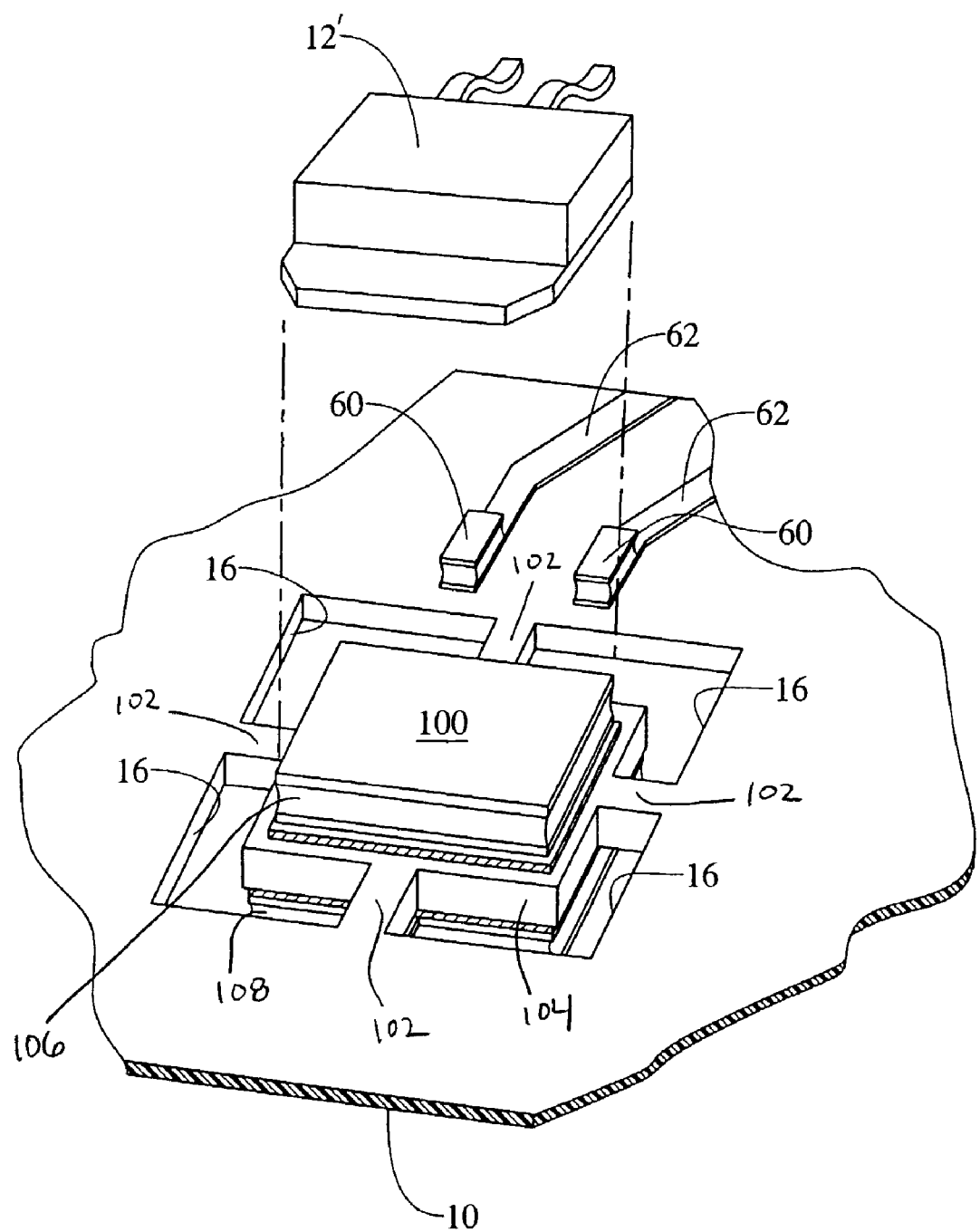
FIG. 4 is a perspective view of a portion of a circuit board including a thermal stack for mounting a power device wherein the thermal stack includes a core layer that is mechanically attached to the circuit board core layer, in accordance with the present invention.

Referring now to FIG. 4, an alternate embodiment of a center stack is illustrated in a perspective view and identified by reference numeral 100, in accordance with the present invention. In the present embodiment, center stack 100 is mechanically attached to the rest of circuit board 10 by bridges 102 that are formed from portions of the core layer of circuit board 10. More specifically, as previously described circuit board 10 is comprised of a core layer sandwiched between two ETM layers 106 and 108. Thus, as illustrated in FIG. 4, a portion of the core layers of circuit board 10 forms bridges 102. Thus, core layer 104 of center stack 20 is contiguous with the rest of the core layer of circuit board 10. ETM layers 106 and 108 are, as shown in FIG. 4, isolated from the rest of circuit board 10 by cooling apertures 16.

As any person skilled in the art of systems and methods for mounting power devises in electronic assemblies and systems and methods for removing heat from such devices will recognize from the previous detailed description and from the figures and claims, modifications and changes can be made to the preferred embodiments of the invention without departing from the scope of this invention defined in the following claims.

We claim:

1. A circuit board comprising:
   a first conductor layer forming a plurality of conductive circuit traces disposed on a first plane for interconnecting electronic components;
   a second conductive layer forming a plurality of conductive circuit traces disposed on a second plane for interconnecting electronic components, wherein the second plane is spaced a part from the first plane;
   a substrate for supporting the first conductor layer;
   a pedestal formed from at least one of the substrate, the first and second conductor layers for supporting at least one of the plurality of electronic components, wherein the pedestal provides a heat conduction path for conducting heat away from the at least one of the plurality of electronic components;
   an aperture in the substrate around the pedestal for allowing a fluid to pass through at least one of the substrate the first and second conductor layers; and
   a plurality of bridges that traverse the aperture, wherein the plurality of bridges are formed from one of the first and second conductive layers and connected at a first end to the pedestal and at a second end to the substrate.

2. The circuit board of claim 1 wherein the first conductor layer is an etched tri-metal circuit.

3. The circuit board of claim 1 further comprising a second conductor layer forming a plurality of conductive circuit traces for interconnecting electronic components.

4. The circuit board of claim 1 wherein the substrate further comprises a plurality of metal layers.

5. The circuit board of claim 4 wherein the substrate further comprises a copper metal layer.

6. The circuit board of claim 1 further comprising a first intermediate layer disposed between the first conductor layer and the substrate.

7. The circuit board of claim 1 wherein the pedestal further comprises a portion of the first intermediate layer and a portion of the substrate.

8. The circuit board of claim 1 further comprising a solder layer disposed between the at least one of the plurality of electronic components and the pedestal.

9. The circuit board of claim 1 wherein the plurality of bridges are formed from the first conductor layer.

10. A circuit board comprising:
    a first etched tri-metal layer forming a first plurality of conductive circuit traces disposed on a first plane for interconnecting a first plurality of electronic components;
    a core layer for supporting the first etched tri-metal layer;
    a second etched tri-metal layer attached to the core layer, wherein the second etched tri-metal layer forms a second plurality of conductive circuit traces disposed on a second plane for interconnecting a second plurality of electronic components, wherein the second plane is spaced a part from the first plane;
    a pedestal formed from the core layer for supporting at least one of the first and second plurality of electronic components, wherein the pedestal provides a heat conduction path for conducting heat away from the at least one of the first and second plurality of electronic components,
    an aperture disposed in the core layer around the pedestal for allowing a fluid to pass through the core layer, and
    a plurality of bridges formed from the first and second etched tri-metal layers and spanning the aperture for connecting pedestal to the core layer.

11. The circuit board of claim 10 wherein the core layer further comprises a plurality of metal layers.

12. The circuit board of claim 11 wherein the core layer further comprises a copper metal layer.

13. The circuit board of claim 10 further comprising a first intermediate layer disposed between the first etched tri-metal layer and the core layer.

14. The circuit board of claim 10 wherein the pedestal further comprises a portion of the first intermediate layer and a portion of the core layer.

15. The circuit board of claim 10 further comprising a solder layer disposed between the at least one of the plurality of electronic components and the pedestal.

16. The circuit board of claim 10 wherein the plurality of bridges are formed from the first etched tri-metal layer.

* * * * *